United States Patent [19]

Akagiri et al.

[11] 4,427,950

[45] Jan. 24, 1984

[54] NOISE REDUCTION CIRCUIT

[75] Inventors: Kenzo Akagiri; Masayuki Katakura, both of Yokohama; Motomi Ookouchi, Tokyo, all of Japan

[73] Assignee: Sony Corporation, Tokyo, Japan

[21] Appl. No.: 298,099

[22] Filed: Aug. 31, 1981

[30] Foreign Application Priority Data

Sep. 3, 1980 [JP] Japan .............................. 55-121208

[51] Int. Cl.³ .......................... H03F 1/26; H03G 3/10
[52] U.S. Cl. ..................................... 330/149; 330/284
[58] Field of Search ................. 330/86, 126, 149, 278, 330/284, 302; 328/145; 307/493

[56] References Cited

U.S. PATENT DOCUMENTS 4,281,295 7/1981 Nishimura ........................... 330/126

Primary Examiner—James B. Mullins
Assistant Examiner—Gene Wan
Attorney, Agent, or Firm—Lewis H. Eslinger; Alvin Sinderbrand

[57] ABSTRACT

A noise reduction circuit for use in an audio signal recording/reproducing apparatus includes a first filter circuit for providing frequency emphasis to a signal supplied thereto; a first signal path connected in series with the first filter circuit, and including a voltage-controlled amplifier for amplifying a signal supplied thereto with controllable gain and a second filter circuit for providing frequency emphasis to the signal passing through the voltage-controlled amplifier; a level detecting circuit for controlling the gain of the voltage-controlled amplifier in response to the level of the signal passing through the voltage-controlled amplifier; a resistor connected to the first signal path for reducing the effect of the frequency emphasis by the second filter circuit when the level of the signal passing through the voltage-controlled amplifier is reduced; and a low pass filter circuit connected with the first signal path for reducing the effect of the frequency emphasis by the first and second filter circuits when the level of the signal passing through the voltage-controlled amplifier is high; wherein the circuit for noise reduction provides a first amount of frequency emphasis for intermediate level signals supplied thereto and a second lower amount of frequency emphasis for low and high level signals supplied thereto. When used in its encoding mode, the first and second filter circuits each include a high-pass filter circuit, and when used in its decoding mode, these filter circuits each include a low-pass filter circuit.

27 Claims, 13 Drawing Figures

FIG.3
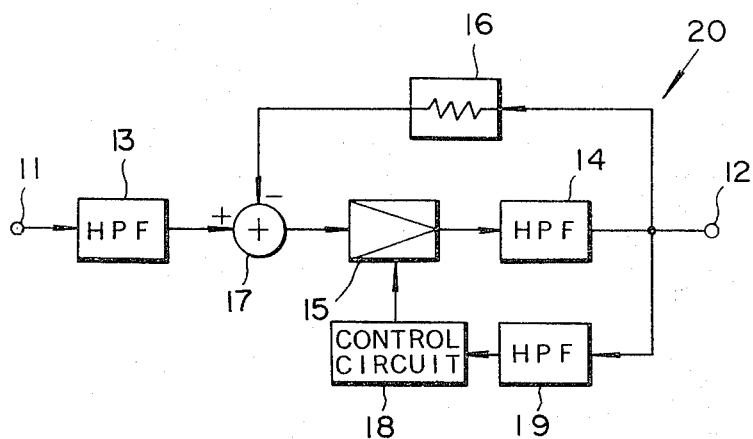
FIG.4A
FIG.4B
FIG.4C
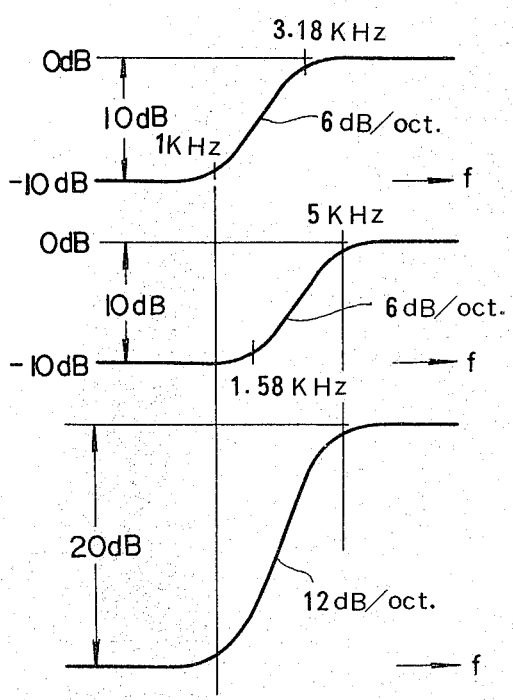

NOISE REDUCTION CIRCUIT

BACKGROUND OF THE INVENTION

1. Field of the Invention

This invention relates generally to information signal recording and reproducing apparatus and, more particularly, is directed to a noise reduction circuit for reducing noise generally accompanying a reproduced information signal in an information signal recording and reproducing apparatus.

2. Description of the Prior Art

Noise reduction circuits for reducing noise and distortion which accompany a reproduced information signal are well known in the art. Such noise reduction circuits are designed to increase the dynamic range of the signal that can be recorded and reproduced from a recording medium such as a magnetic tape. In a typical noise reduction circuit, an encoder is provided for those signals which are to be recorded, and a complementary decoder is provided for those signals which are reproduced. The encoder generally includes a level compression circuit and a high frequency pre-emphasis circuit, wherein high frequency components of an information signal to be recorded are emphasized and the information signal is compressed with the compression level being inversely related to the information signal level. The decoder generally includes a level expansion circuit and a high frequency de-emphasis (low frequency emphasis) circuit to perform a complementary operation on the information signals which are reproduced.

A problem that results with conventional noise reduction systems is that they may be subject to so-called noise modulation. With noise modulation, noise components are varied as a function of input signal level variations. Such change in the noise components, or noise modulation, is highly perceptible and is quite distracting when it accompanies a reproduced audio signal. This phenomenon is produced when the frequency components of the input signal are noticeably different from the noise frequency components. For example, if the information signal is an audio signal representing the sound of a piano, noise modulation is heard separately and distinctly, and is not masked even if the volume level of the information signal is increased.

One proposal for reducing noise modulation in a noise reduction circuit is described in U.S. Pat. No. 4,162,462. In this proposal, the high frequency components of the information signal are pre-emphasized prior to recording when the information signal exhibits low and intermediate signal levels, and relatively little pre-emphasis is provided when the information signal exhibits higher levels. When the information signal processed in the foregoing manner is reproduced, the high frequency components are subjected to relatively high de-emphasis when the reproduced signal exhibits low and intermediate signal levels, and these high frequency components are subjected to relatively low de-emphasis when the reproduced signal is at a higher level. Although this proposal reduces the undesired effects of noise modulation, saturation of the magnetic record medium due to overshoot in the compressed signal nevertheless is present.

Accordingly, a noise reduction circuit which reduces noise modulation and also prevents transient saturation of the record medium has been proposed in U.S. patent application Ser. Nos. 06/226,821 and 06/226,822, both filed on Jan. 21, 1981 and both having a common assignee herewith. Thus, for example, in the encoder circuit of the first-mentioned U.S. patent application Ser. No. 06/226,821, a low level audio input signal has its high-frequency components pre-emphasized, but high level signals are processed with a substantially flat frequency characteristic. In other words, the input-output level characteristic of the encoder varies with frequency when the input signal level is low. However, due to differences in sensitivity of different magnetic tapes and/or different recording and reproducing apparatus with which a magnetic tape may be used, in noise reduction circuits of the above type in which the input-output level characteristic thereof varies with frequency, a level deviation may result between the level of the encoded signal which is recorded on a magnetic tape by means of a tape recording apparatus and the level of the reproduced output signal from the tape. This variation may result in unsatisfactory reproduction of the audio signal when processed by a corresponding decoder circuit. Practically speaking, this means that the dynamic range within which the audio signal can be processed must be reduced.

OBJECTS AND SUMMARY OF THE INVENTION

Accordingly, it is a principal object of this invention to provide an improved circuit for noise reduction that avoids the above-described difficulties encountered with the prior art.

More particularly, it is an object of this invention to provide a circuit for noise reduction which provides satisfactory encoding and decoding of an input signal over the entire audio frequency range for low level signals so as to increase the dynamic operating range of the recording and reproducing system.

It is another object of this invention to provide a circuit for noise reduction that reduces noise modulation by providing a variable frequency emphasis characteristic so as to provide a large amount of pre-emphasis for intermediate level, high frequency components of an information signal and a smaller amount of pre-emphasis for most other conditions.

It is still another object of this invention to provide an improved compression/expansion circuit which can be switchably connected so as to provide a level compression function when used with a signal recorder and to provide a level expansion function when used with a signal reproducer.

It is yet another object of this invention to provide a circuit for noise reduction that is simple in construction and inexpensive.

In accordance with an aspect of this invention, a circuit for noise reduction includes first means for providing frequency emphasis to a signal supplied thereto; a first signal path connected in series with the first means, and including variable gain amplifier means for amplifying a signal supplied thereto with controllable gain and second means for providing frequency emphasis to the signal passing through the variable gain amplifier means; means for controlling the gain of the variable gain amplifier means; and means connected with the first signal path for reducing the effect of the frequency emphasis by the second means when the level of the signal passing through the variable gain amplifier means is reduced, wherein the circuit for noise reduction provides a first amount of frequency emphasis for intermediate level signals supplied thereto and a second lower amount of frequency emphasis for low level signals supplied thereto.

The above, and other, objects, features and advantages of the present invention will become readily apparent from the ensuing detailed description of the illustrative embodiments of the invention which is to be read in connection with the accompanying drawings.

BRIEF DESCRIPTION OF THE DRAWINGS

FIG. 3 is a block diagram of an encoder circuit according to a basic embodiment of the present invention;

FIGS. 4A–4C are schematic diagrams used for explaining the frequency characteristic of the circuit of FIG. 3 for different levels of the input signal;

DETAILED DESCRIPTION OF THE PREFERRED EMBODIMENTS

Figure 1:
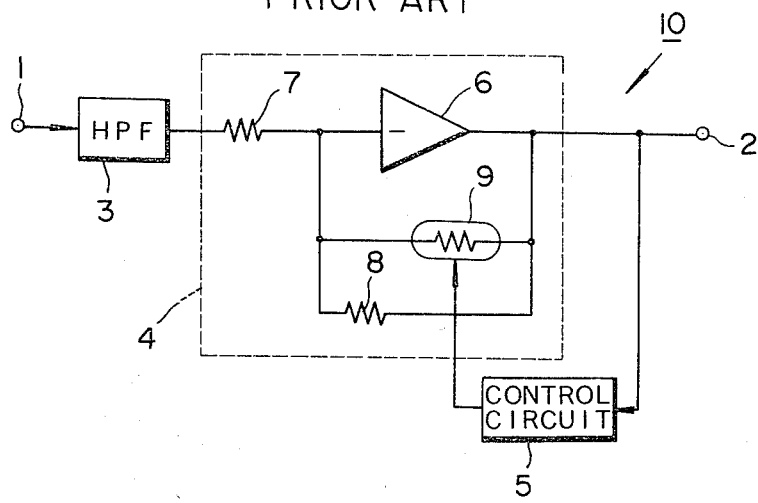
FIG. 1 is a block-circuit wiring diagram of a prior art noise reduction circuit.

Referring to the drawings in detail, and initially to FIG. 1 thereof, there is shown a noise reduction circuit 10 according to the prior art which is used as an encoder circuit. The encoder circuit 10 of FIG. 1 includes an input terminal 1 supplied with an information signal, such as an audio signal, which is passed through encoder circuit 10 where it is encoded and supplied to an output terminal 2 to be recorded by a recording and reproducing apparatus, for example, on a magnetic tape. Encoder circuit 10 includes a high-pass filter 3 which is supplied with the audio signal from input terminal 1 and which functions to pre-emphasize high frequency components of the audio signal supplied thereto. The preemphasized output from high-pass filter 3 is supplied to a variable gain amplifier 4 which amplifies the output of high-pass filter 3 with a variable gain. As will now be described, the gain of amplifier 4 is inversely related to the signal level of the audio input signal such that the gain thereof is relatively high when the input level is relatively low and conversely, the gain thereof is relatively low when the input level is relatively high. In the embodiment shown in FIG. 1, a control circuit 5 detects the output of variable gain amplifier 4 and controls the gain of variable gain amplifier 4 by means of a gain control signal produced in response to such detection.

In particular, variable gain amplifier 4 includes an operational amplifier 6 supplied at its inverting input with the preemphasized signal from high-pass filter 3 through a resistor 7. A negative feedback path between the output of operational amplifier 6 and the inverting input thereof is comprised of a negative feedback resistor 8 with a fixed resistance value and a variable resistance element 9 connected in parallel with negative feedback resistor 8. The resistance of variable resistance element 9 is controlled in accordance with the output of control circuit 5 which, in turn, is supplied with the output of variable gain amplifier 4, as previously discussed. It should be appreciated that any suitable arrangement may be utilized for variable resistance element 9. As one example, variable resistance element 9 may be comprised of a photo-responsive element, such as a CdS photoconductive cell connected between the output and inverting input of operational amplifier 6, and which exhibits an impedance or resistance that is variable as a function of the intensity of light impingent thereon. The photo-responsive element may be light coupled to a light emitting element (not shown), such as a light emitting diode, which emits light in accordance with a control voltage from control circuit 5 for irradiating the photo-responsive element. In this manner, depending on the level of the control signal from control circuit 5, the resistance value of variable resistance element 9 is varied so as to vary the gain of variable gain amplifier 4.

In the circuit shown in FIG. 1, an increase in the input signal level results in a decrease in the resistance of variable resistance element 9, causing control circuit 5 to reduce the gain of operational amplifier 6. This results in variable gain amplifier applying a compression characteristic, with the amount of compression increasing with increasing levels of the input signal. Conversely, for low levels of the input signal, the resistance of variable resistance element 9 is increased so as to increase the gain of variable gain amplifier 4. The negative feedback resistor 8 connected in parallel with variable resistance element 9 serves to control the maximum gain of variable gain amplifier 4 by limiting the negative feedback resistance of operational amplifier 6 when the resistance of variable resistance element 9 is greatly increased in accordance with very low input signal levels.

It should be appreciated that the level of the input signal supplied to variable gain amplifier 4 depends upon the frequency of the audio signal supplied to high-pass filter 3 through input terminal 1. For relatively high levels of the audio signal passed through high-pass filter 3, the gain of variable gain amplifier 4 is relatively low, and varies with the level of the signal supplied thereto. Because of the gain characteristic applied by variable gain amplifier 4 in such case, the input-output level characteristic for high level signals is dependent substantially only on the level of the signals and is not frequency dependent.

However, when the audio signal supplied to input terminal 1 is of a low level, the gain of variable gain amplifier 4 is relatively high and, in fact, may be constant as a result of negative feedback resistor 8. This means that the signal produced at output terminal 2 is both level and frequency dependent, as a result of the frequency characteristic imparted by high-pass filter 3. This is shown by the curves in FIG. 2 which represents the level-compression characteristic of encoder circuit 10 for input signals having frequencies of 100 Hz, 1

Figure 2:
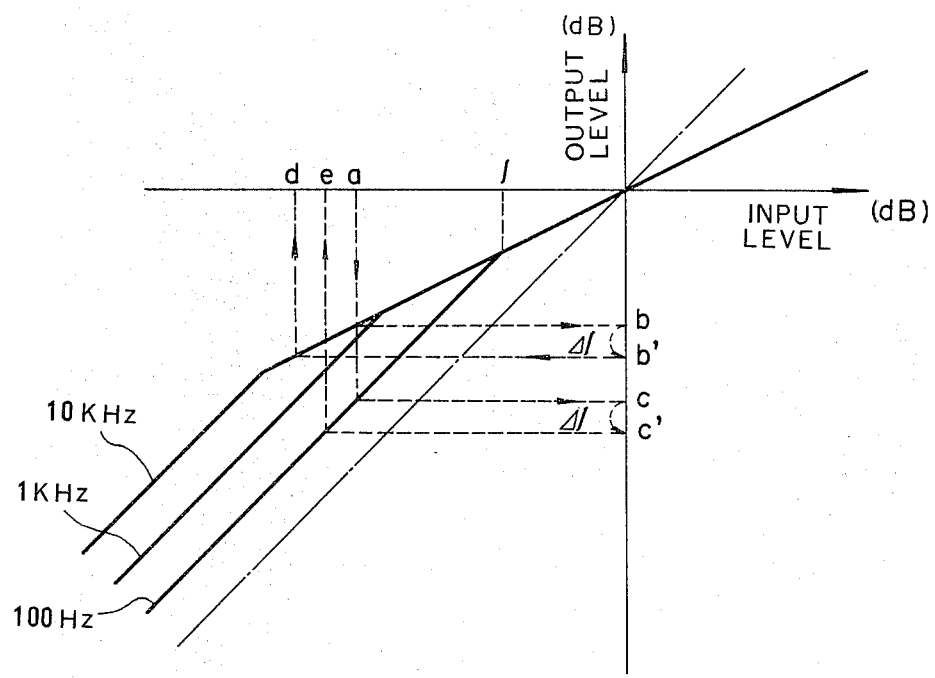
FIG. 2 is a graphical representation of the input-output level characteristic of the noise reduction circuit of FIG. 1 for various frequencies.

KHz and 10 KHz. It is seen from FIG. 2 that, for low level input signals supplied to input terminal 1, the level of the output signal at output terminal 2 is both level and frequency dependent while, for higher level input signals, the level of the output signal is substantially frequency independent. The dot-dash line shown in FIG. 2 represents the usual flat bass or unity gain response. Substantially identical results are obtained when high-pass filter 3 is connected to output terminal 2 rather than to input terminal 1. Further, an input-output level characteristic which is inverse to that shown in FIG. 2 can be obtained for a complementary decoder circuit which effects a level expansion and de-emphasis operation.

With the type of noise reduction circuit shown in FIG. 1, if the output or recording level of the encoder circuit deviates slightly from the input or reproducing level of a complementary decoder circuit, for example, due to fluctuations or differences in the sensitivity of different magnetic tapes and/or different recording and reproducing apparatus with which a magnetic tape may be used, there may result a fluctuation or deviation in the level of the output signal from the decoder circuit as a function of frequency. Such deviation, of course, results in unsatisfactory reproduction. For example, as shown in FIG. 2, when the input signal supplied to encoder circuit 10 has a level a, the output signal from the encoder circuit has a level b for a signal frequency of 10 KHz, that is, the compression ratio between the output and input signal levels is equal to 2. For the same input signal level but with a signal frequency of 100 Hz, the output signal from the encoder circuit has a level c and, in such case, variable gain amplifier 4 of encoder circuit 10 has a unity gain. If a level reduction Δl is produced by, for example, the magnetic tape used and/or by the recording and reproducing apparatus connected to output terminal 2 of encoder circuit 10, the levels b and c of the signal supplied to the complementary decoder circuit are changed to levels b' and c', respectively.

The decoder circuit, as previously discussed, has an input-output level characteristic which is inverse to that of the encoder circuit 10 shown in FIG. 2 for the curves shown therein. In this manner, the input signal to the decoder circuit which has a level b' is decoded to produce a decoded output signal having a level d for a signal frequency of 10 KHz, and the input signal to the decoder circuit having a level c' is transformed to a decoded output signal having a level e for a signal frequency of 100 Hz. It should be appreciated that, since the compression ratio of the 10 KHz signal is equal to 2 and the compression ratio of the 100 Hz signal is equal to unity, the effected change in level for the original 10 KHz signal, represented by the level difference between points a and d, is twice the difference in level effected for the original 100 KHz signal, that is, the level difference between points a and e, in terms of decibel units. In other words, the complementary decoder circuit produces a fluctuation or deviation in the level of the decoded output signal therefrom which is frequency dependent, even though the original fluctuation or deviation Δl imparted by the tape and/or by the tape recording and reproducing apparatus had no frequency dependence. This deviation in the level of the decoded output signal may become even more apparent if, for example, the differences in tape sensitivity between different magnetic tapes varies in accordance with frequency. For example, one tape may be more sensitive to only high frequency components than another tape. Also, if the level of the input signal supplied to the encoder circuit fluctuates or deviates, for example, in the neighborhood of level a, the decoded output signal from the complementary decoder circuit is subjected to a level variation which is frequency dependent in the same manner as discussed above. This, of course, may result in unsatisfactory reproduction. Accordingly, the level of the input signal that can be used with prior art noise reduction systems must be greater than a predetermined level l, shown in FIG. 2, so as to make the input-output level characteristic (FIG. 2) essentially frequency independent. This, of course, results in a reduction of the dynamic range within which the recording and reproducing system can operate.

Accordingly, there is shown in FIG. 3 a noise reduction circuit 20 according to a basic embodiment of this invention which is used as an encoder circuit at the input side of, for example, an audio tape recorder. An input information signal, such as an audio signal, is supplied to an input terminal 11 of encoder circuit 20 and is subjected to a high frequency pre-emphasis operation and a level compression operation in the encoder circuit. The encoded output signal is supplied through an output terminal 12 to a recording input of, for example, an audio tape recorder. In particular, encoder circuit 20 includes a first high-pass filter 13 supplied with the audio signal from input terminal 11 for pre-emphasizing the high frequency components thereof, and the pre-emphasized output from high-pass filter 13 is supplied to an adding or positive input of a subtraction circuit 17. The output from subtraction circuit 17 is supplied to output terminal 12 through a first signal path comprised of the series connection of a variable gain amplifier 15 and a second high-pass filter 14. In other words, the first signal path is connected in series with high-pass filter 13 through subtraction circuit 17. Variable gain amplifier 15 may be a voltage controlled amplifier (VCA) which operates in a similar manner to variable gain amplifier 4 of FIG. 1 by providing a high gain for low level input signals and a low gain for high level input signals so as to provide a level compression characteristic. The output from variable gain amplifier 15 is supplied to high-pass filter 14 which imparts a high frequency pre-emphasis characteristic thereto and which, in turn, produces the encoded output signal at output terminal 12.

The output of high-pass filter 14 is also supplied to a control path comprised of the series connection of a third high-pass filter 19 and a control circuit 18, the latter circuit supplying a control voltage to voltage controlled amplifier 15 for controlling the gain thereof. In particular, high-pass filter 19 functions as a weighting circuit for weighting the signal supplied thereto in accordance with the frequency thereof, and control circuit 18 may be comprised of a level detecting circuit which detects the level of the signal from high-pass filter 19. As with the embodiment of FIG. 1, control circuit 18 controls the gain of variable gain amplifier 15 so that the gain thereof is increased for low level input signals and is decreased for high level input signals. In addition, a second signal or feedback path 16 having a substantially flat frequency characteristic is connected in parallel with the first signal path through subtraction circuit 17. In other words, feedback path 16 essentially provides no gain control to the signals supplied thereto and may be constituted, for example, merely by a resistor. Feedback path 16 is supplied with the output from high-pass filter 14 and, in turn, supplies an output to the subtracting or negative input of subtraction circuit 17 where it is subtracted from the output of high-pass filter 13. The resultant signal produced by subtraction circuit 17 is supplied to the input of variable gain amplifier 15.

The encoder circuit 20 of FIG. 3 operates to pre-emphasize and level compress the input signal supplied to input terminal 11 with a variable frequency characteristic which is dependent on the level of the input signal. In particular, first high-pass filter 13 has a high frequency pre-emphasis characteristic, as shown in FIG. 4A, which results in an approximately 10 dB difference in level between low and high frequency components of the input signal. This level or gain deviation occurs in a frequency region beginning at a frequency in the neighborhood of 1 KHz and which increases at a rate of 6 db/octave until the approximately 10 db deviation in level is reached at a frequency in the neighborhood of 3.18 KHz. The second high-pass filter 14 in the first signal path has a high frequency emphasis characteristic, as shown in FIG. 4B, which results in an approximately 10 dB difference in level between low and high frequency components of a signal supplied thereto. As with high-pass filter 13, this level or gain deviation occurs in a frequency range beginning at a frequency in the neighborhood of 1.58 KHz and which rises with a slope of 6 dB/octave until the approximately 10 dB level deviation is achieved at a frequency in the neighborhood of 5 KHz. The combined emphasis characteristic of a signal passing through both high-pass filters 13 and 14 is shown in FIG. 4C and results in an approximately 20 dB level deviation between low and high frequency components of a signal passing therethrough. The level or gain deviation occurs in a frequency range which begins at a frequency in the neighborhood of 1 KHz defined by high-pass filter 13 and which rises with a slope of 12 dB/octave until the 20 dB level deviation is achieved at a frequency in the neighborhood of 5 KHz defined by high-pass filter 14.

If the level of the signal supplied to the adding input of subtraction circuit 17 is designated by x, the level of the output signal at output terminal 12 is designated by y, the resistance value of the resistor of feedback path 16 is designated by R, and the gain of variable gain amplifier 15 is designated by G, then the following equation can be developed which defines the relationship between the first and second paths:

$$(x - y \cdot R) \cdot G = y \quad (1)$$

Equation (1) can be simplified to form an equation for the level y of the output signal as a function of the level x of the input signal, as follows:

$$y = Gx/(1 + RG) \quad (2)$$

It should be appreciated, that when the level x of the input signal to subtraction signal 17 is low, the gain of variable gain amplifier 15 is high. If it is assumed that the gain $G \gg 1$ in such case, equation (2) can be simplified as follows:

$$y = (1/R)x \quad (3)$$

Figure 5:
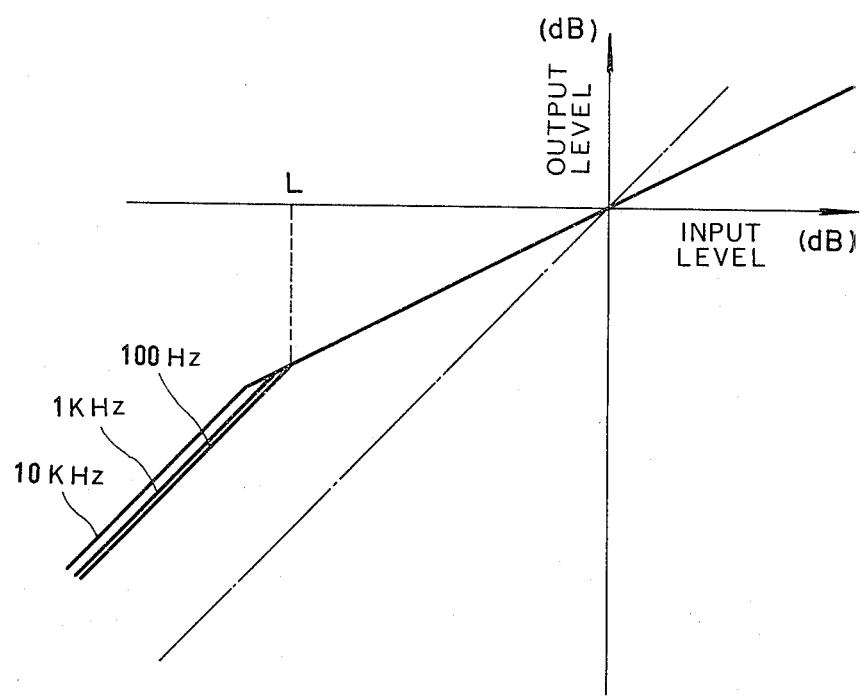
FIG. 5 is a graphical representation of the input-output level characteristic of the encoder circuit of FIG. 3 for various frequencies.

Thus, when the gain G of variable gain amplifier 15 is increased, the amount of negative feedback supplied by feedback path 16 is increased to limit any further increase in gain of the amplifier portion of the circuit of FIG. 3 which is constituted by variable gain amplifier 15, high-pass filter 14 and feedback path 16. In such case, the gain of the amplifier portion of the circuit of FIG. 3 is fixed at an upper limit to a value substantially equal to the inverse of the characteristic of the feedback path 16. In other words, the gain characteristic of the amplifier portion of the circuit of FIG. 3 is a substantially flat frequency characteristic, that is, it is independent of frequency. Thus, for low level input signals, the frequency characteristic of encoder circuit 20 is imparted to the input signal only by high-pass filter 13. In other words, second signal path 16 effectively reduces the effect of the frequency emphasis by high-pass filter 14. Accordingly, the frequency characteristic of high-pass filter 13, shown in FIG. 4A, is the only frequency characteristic imparted by encoder circuit 20 so as to provide a first low degree of pre-emphasis to the input signal. The frequency characteristic imparted only by high-pass filter 13 is commonly termed a primary filter characteristic. As previously discussed, encoder circuit 20, in such case, provides a level difference of approximately 10 dB between low and high frequency components of the input signal and has a response slope of approximately 6 dB/octave. Thus, the effect of pre-emphasis for low level input signals is relatively small. In such case, because of the low amount of high frequency pre-emphasis, the input-output level curves for low level input signals having frequencies of 10 KHz, 1 KHz and 100 Hz are close to one another or bunched together, as shown in FIG. 5. This means that fluctuations or differences in sensitivity of different tapes and/or different recording and reproducing apparatus will not greatly affect the audio signal as with the prior art circuit of FIG. 1. Thus, for the case of low level input signals where the gain of encoder circuit 20 is fixed by equation (3), the range of levels of the input signal within which the noise reduction circuit according to this invention can operate can be extended beyond the range previously determined in regard to FIG. 2. In other words, the lower limit of the level of the input signal can be extended to a level L, shown in FIG. 5, so as to increase the dynamic operating range of the recording/reproducing system.

When the level of the input signal is increased to an intermediate or high level signal, the gain of variable gain amplifier 15 is reduced whereby the gain of encoder circuit 20 is determined by equation (2). Since the gain of variable gain amplifier 15 is no longer constant, a high frequency pre-emphasis characteristic is imparted by high-pass filter 14 to the signal passing through variable gain amplifier 15. In such case, the high frequency pre-emphasis characteristic of encoder circuit 20 results from the combination of the pre-emphasis characteristics of high-pass filters 13 and 14, shown in FIG. 4C, and which is commonly termed a secondary filter characteristic. As previously discussed, this latter pre-emphasis characteristic results in an approximately 20 dB level difference between low and high frequency components of the input signal supplied to input terminal 11, with a response slope of about 12 dB/octave. In this manner, the pre-emphasis applied by encoder circuit 20 can be increased to provide increased separation of the low and intermediate frequency range from the high frequency range, thereby providing a further reduction of any noise modulation during reproduction of low and intermediate frequency components of the input signal.

It should be appreciated that various modifications can be effected with the connections of the individual elements of the encoder circuit of FIG. 3 while still maintaining the aforementioned desirable characteristics. For example, the positions of variable gain amplifier 15 and high-pass filter 14 in the first signal path can be interchanged, that is, it is only important that high-pass filter 14 emphasize the high frequency components of the signal passing through variable gain amplifier 15. In addition, high-pass filter 13 may alternatively be connected between the connection point of the first and second signal paths and output terminal 12 where it is still connected in series with the first signal path. Also, the signal supplied to the control path constituted by control circuit 18 and high-pass filter 19 may be taken from any point in the first signal path. For example, high-pass filter 19 may be connected to either the input or output of variable gain amplifier 15 or may even be supplied with a signal corresponding to the sum or difference of the input and output signals to and from variable gain amplifier 15. In addition, although variable gain amplifier 15 has been described as a voltage controlled amplifier, it should be appreciated that various other types of variable gain amplifiers may be used in which the gain is increased for decreasing signal levels and decreased for increasing signal levels.

Figure 6:
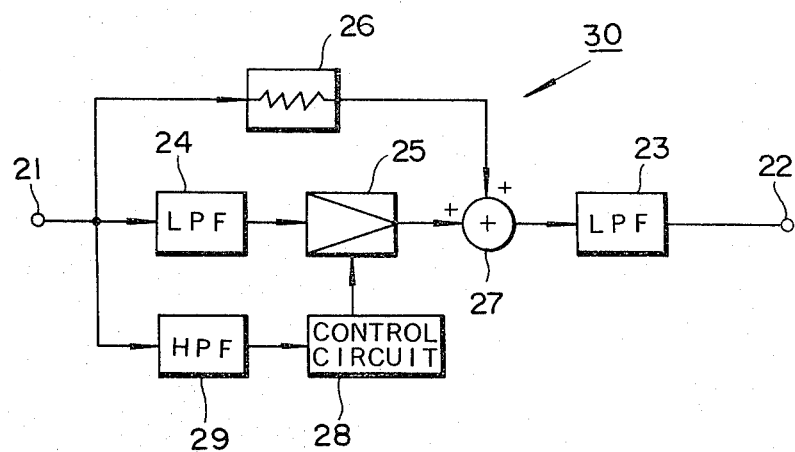
FIG. 6 is a block diagram of a decoder circuit according to a basic embodiment of the present invention.

Referring now to FIG. 6, there is shown a noise reduction circuit 30 according to a basic embodiment of the present invention which can be used as a decoder circuit and which has an input-output level characteristic which is complementary to that of encoder circuit 20 of FIG. 3. In other words, decoder circuit 30 provides an expansion and de-emphasis characteristic to the reproduced and encoded signal which is the reverse of the characteristic imparted by encoder circuit 20 of FIG. 3 so as to return the encoded signal to its original form.

In particular, an encoded signal which is recorded on a record medium, such as a magnetic tape, is supplied by transducers or the like to an input terminal 21 of decoder circuit 30. The encoded input signal is decoded to return it to its original form by decoder circuit 30, and then transmitted to an output terminal 22. More particularly, decoder circuit 30 includes a first signal path comprised of a low-pass filter 24 supplied with the encoded input signal from input terminal 21, and a variable gain amplifier 25 supplied with the output from low-pass filter 24. Low-pass filter 24 imparts a high frequency de-emphasis characteristic, that is, a low frequency emphasis characteristic, to the input signal from input terminal 21 which is complementary to the high frequency pre-emphasis characteristic imparted by high-pass filter 14 of encoder circuit 20 of FIG. 3, that is, a characteristic which is inverse to that shown in FIG. 4A. Variable gain amplifier 25, which may be a voltage controlled amplifier or other suitable variable gain circuit, imparts a level expansion characteristic to the de-emphasized output of low-pass filter 24 with a gain which is dependent on the input signal level. In particular, the gain of variable gain amplifier 25 is controlled so as to be low for low input signal levels and to be high for high input signal levels. A control path for controlling the gain of variable gain amplifier 25 is comprised of a high-pass filter 29 supplied with the input signal from input terminal 21 and a control circuit 28 supplied with the output of high-pass filter 29 and which, in turn, produces a control signal supplied to variable gain amplifier 25 for controlling the gain thereof, as aforementioned. Control circuit 28 may include a level detecting circuit which detects and smooths the output of high-pass filter 29 and produces a corresponding output in response thereto. The output of variable gain amplifier 25 is supplied to an adding or positive input of an adder circuit 27.

Further, a second signal or feedforward path 26 having a flat frequency characteristic, that is, one which is independent of frequency, is connected in parallel with the first signal path constituted by low-pass filter 24 and variable gain amplifier 25 through adder circuit 27. Feedforward path 26 essentially provides no gain control and may be comprised merely of a resistor which is supplied with the input signal from input terminal 21 and supplies an output signal to a second adding or positive input of adder circuit 27. The output of adder circuit 27 is supplied to a low-pass filter 23 which imparts a high frequency de-emphasis, that is, a low frequency emphasis, characteristic to the output of adder circuit 27, and the output of low-pass filter 23, in turn, supplies the decoded output signal to output terminal 22. The frequency characteristic imparted by low-pass filter 23 is complementary to the characteristic imparted by high-pass filter 13 of encoder circuit 20 of FIG. 3 and therefore has an inverse characteristic to that shown in FIG. 4B.

If the level of the encoded signal at input terminal 21 is designated by y, the level of the output signal from adder circuit 27 is designated by z, the gain of variable gain amplifier 25 is designated by G, and the resistance value of the resistor of feedforward path 26 is designated by R, the following equation can be derived:

$$z = (G+R)y \quad (4)$$

For very low levels of the encoded input signal, the gain G of variable gain amplifier 25 is extremely low, and it can be assumed that R>>G. Accordingly, equation (4) can be simplified as follows:

$$z = Ry \quad (5)$$

In other words, for low levels of the encoded input signal, feedforward path 26 effectively reduces or eliminates the effect of the low frequency emphasis by low-pass filter 24, whereby the frequency characteristic imparted by decoder circuit 30 is determined solely by low-pass filter 23 which, as previously discussed, has a characteristic inverse to that shown in FIG. 4A with two turn-over frequencies. In such case, any difference in the input-output level characteristic of decoder circuit 30 for high and low frequency components of a low level signal is reduced in much the same manner as previously described in regard to FIG. 5. This means that reproduction errors due to differences in tape sensitivity and the like can be reduced or substantially eliminated.

For intermediate or high levels of the encoded input signal, the gain of the signal supplied through the first signal path is not solely determined by the second feedforward path. This means that the signal supplied through decoder circuit 30 has a high frequency de-emphasis characteristic imparted thereto by both low-pass filters 23 and 24 which produce a frequency characteristic which is inverse to that shown in FIG. 4C, with a 20 dB level difference between high and low frequency components and with a maximum slope of response of approximately 12 dB/octave. In this manner, the effect of the high frequency de-emphasis (low frequency emphasis) is increased so that separation between low and intermediate frequency components and high frequency components is increased and noise modulation is reduced.

It should be appreciated, as with encoder circuit of FIG. 3, that the position or arrangement of low-pass filter 24 and variable gain amplifier 25 are interchangeable and that low-pass filter 23 may alternatively be connected between input terminal 21 and the input connection point between the first and second signal paths. In addition, the control path and, in particular, high-pass filter 29 thereof, can be supplied with any signal from the first signal path. For example, the input of high-pass filter 29 can be connected to either the input or output of variable gain amplifier 25 or may even be supplied with the sum or difference of the input and output signals to and from variable gain amplifier 25.

Figure 7:
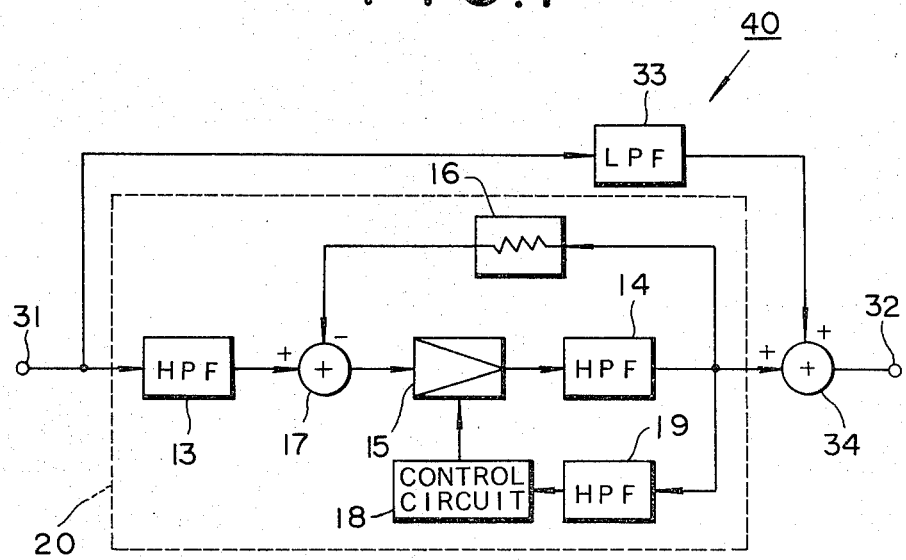
FIG. 7 is a block diagram of an encoder circuit according to another embodiment of the present invention.

Referring now to FIG. 7, there is shown another embodiment of a noise reduction circuit 40 according to this invention which can be used as an encoder circuit and which constitutes an improvement over the invention disclosed in the aforementioned U.S. patent application Ser. No. 06/226,821, filed Jan. 21, 1981 and having a common assignee herewith. Elements in the encoder circuit 40 of FIG. 7 corresponding to those described above with reference to the encoder circuit 20 of FIG. 3 are identified by the same reference numerals. As shown in FIG. 7, encoder circuit 40 is supplied with an audio input signal at an input terminal 31 thereof. The input signal is then supplied through encoder circuit 20, which has earlier been described in detail in regard to FIG. 3 and a detailed description of which will not be repeated herein, to an adding or positive input of an adder circuit 34. Encoder circuit 40 includes a third signal or feedforward path 33 supplied with the input signal from input terminal 31 and which, in turn, supplies an output signal to adder circuit 34 where it is added to the output of encoder circuit 20. The output of adder circuit 34 constitutes the output of encoder circuit 40 and is supplied to an output terminal 32 thereof. Feedforward path 33 has a flat or substantially flat frequency characteristic, that is, one which is essentially independent of frequency, and is essentially free from gain control. For example, feedforward path 33 may be constituted by a resistor or a low-pass filter which provides relatively minor de-emphasis to the high frequency components of the input signal.

In this embodiment of the present invention, for low level input signals supplied to input terminal 31, the gain of variable gain amplifier 15 is high. This means that, for low level input signals, the input-output characteristic of encoder circuit 40 is primarily determined by encoder circuit 20. In other words, the path constituted by encoder circuit 20 dominates over feedforward path 33 for low level input signals whereby encoder circuit 40 operates in a substantially identical manner to encoder circuit 20 of FIG. 3. As the input signal level increases, the dominance of encoder circuit 20 over feedforward path 33 in determining the overall characteristic of encoder cirucit 40 decreases. For relatively high level input signals, since the gain of variable gain amplifier 15 is reduced, the signal supplied to adder circuit 34 by means of feedforward path 33 dominates over the signal supplied thereto through encoder circuit 20. This results in a reduction in the amount of high frequency emhasis imparted by encoder circuit 40, which has the effect of further reducing noise modulation which results from the mixture of high frequency information signals with low and intermediate frequency noise signals. Thus, in this embodiment, the amount of high-frequency emphasis is greater for intermediate level signals than for low and high level signals.

It should be appreciated that the circuit of FIG. 7 can be modified in a manner substantially identical to the modifications previously proposed in regard to encoder circuit 20 of FIG. 3. In addition, a limiting circuit can be included in the first signal path comprised of variable gain amplifier 15 and high-pass filter 14, for example, at the output side thereof, to prevent or limit transient overshoots due to a sudden increase in the level of the signal supplied to variable gain amplifier 15. Various embodiments of a limiting circuit that can be utilized are shown in U.S. patent application Ser. No. 06/151,154 filed May 19, 1980 and having a common assignee herewith.

Figure 8:
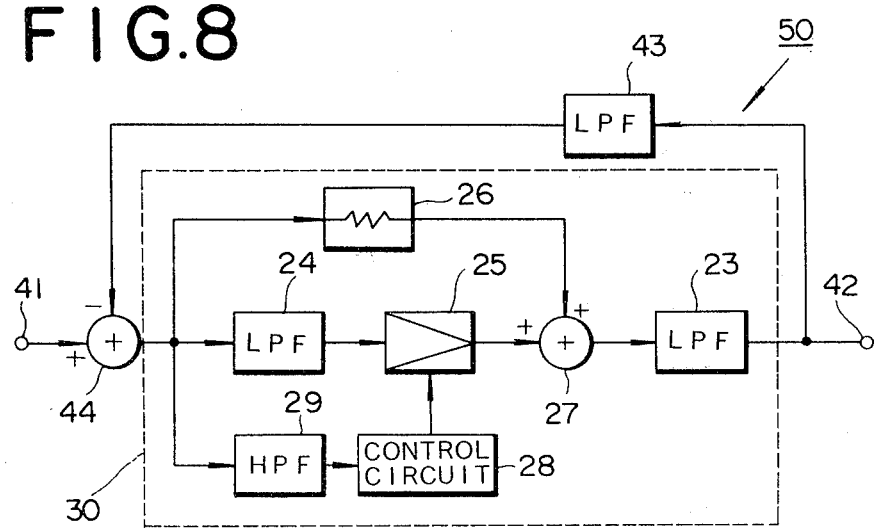
FIG. 8 is a block diagram of a decoder circuit according to another embodiment of the present invention.

Referring now to FIG. 8, there is shown a noise reduction circuit 50 according to another embodiment of this invention which can be used as a decoder circuit, and which is a modification of the decoder circuit 30 of FIG. 6 and an improvement over the invention disclosed in the aforementioned commonly assigned U.S. patent application Ser. No. 06/226,822. Elements in the decoder circuit 50 corresponding to those previously described in regard to the decoder circuit 30 of FIG. 6 are identified by the same reference numerals and a detailed description thereof will not be repeated herein. Decoder circuit 50 includes an input terminal 41 supplied with the reproduced encoded signal from a magnetic tape and which, in turn, supplies the encoded signal to an adding or positive input of a subtraction circuit 44. The output of subtraction circuit 44 is supplied through decoder circuit 30 to an output terminal 42. A third signal or feedback path 43 is supplied with the signal at output terminal 42 and, in turn, supplies a subtraction signal to the negative or subtracting input of subtraction circuit 44. Feedback path 43 functions to reduce the high frequency de-emphasis (low frequency emphasis) characteristic for high level input signals in a complementary manner to that of encoder circuit 40 of FIG. 7. In this regard, feedback path 43 provides a flat or substantially flat frequency characteristic that is free from gain control and may be comprised of a resistor or a low-pass filter which provides relatively minor de-emphasis to the high frequency components of the signal supplied thereto.

Thus, when a low level input signal is supplied to input terminal 41, the gain of variable gain amplifier 25 is relatively low. Because of the relatively low gain provided by variable gain amplifier 25, however, the effect of feedback path 43, the output of which is subtracted from the encoded input signal in subtraction circuit 44, is minimal, that is, decoder circuit 30 dominates over feedback path 43. This means that decoder circuit 50 operates in a substantially identical manner to decoder circuit 30 of FIG. 6 for low level signals supplied thereto so as to provide a small amount of high-frequency de-emphasis (low frequency emphasis).

This small amount of high-frequency de-emphasis increases for increasing levels of the encoded signal supplied to input terminal 41. Thus, when the level of the encoded signal supplied to input terminal 41 is high, the gain of variable gain amplifier 25 is also high. In this case, feedback path 43 effectively reduces the large amount of high-frequency de-emphasis. In other words, at this time, since the gain of variable gain amplifier 25 is relatively high, feedback path 43 plays a dominant role in determining the input-output characteristic of decoder circuit 50 for high level signals supplied thereto. This results in a reduction in the noise modulation which results from the mixture of high frequency information signals with low and intermediate frequency noise signals. Also, as with the complimentary encoder circuit 40 of FIG. 7, the amount of high-frequency de-emphasis (low frequency emphasis) is greater for intermediate level signals than for low and high level signals.

Further, as with encoder circuit 40 of FIG. 7, decoder circuit 50 of FIG. 8 may include a coring or anti-limiting circuit in the first signal path, the latter being comprised of low-pass filter 24 and variable gain amplifier 25. In such case, the anti-limiting circuit provides a complementary characteristic to the aforementioned limiting circuit, discussed in regard to encoder circuit 40 of FIG. 7, for preventing or limiting transient overshoots of the signal which are recorded on the magnetic tape and which may result in distortion of the signal due to saturation of the magnetic tape. The modifications previously discussed in regard to decoder circuit 30 of FIG. 7 may also be provided in decoder circuit 50 of FIG. 8.

Although noise reduction circuit 50 has been used as a decoder circuit for providing level expansion and frequency de-emphasis for information signals which have been recorded, for example, on a magnetic tape, such circuit can be used as an encoder with level compression and high-frequency emphasis which are complementary to the corresponding characteristics of the aforementioned decoder circuit 50 of FIG. 8. As illustrated more particularly in FIG. 9, a noise reduction circuit 150, which is a modification of noise reduction circuit 50 of FIG. 8, may be connected in the negative feedback path of an operational amplifier 103 so as to function as an encoder. In such case, operational amplifier 103 has a non-inverting input coupled to an input terminal 101 to receive an input signal to be recorded, and an inverting input coupled to the output terminal 142 of noise reduction circuit 150. The output of amplifier 103 is coupled to input terminal 141 of noise reduction circuit 150 and to an output terminal 102.

Desirably, noise reduction circuit 150 is selectively disposed for operation either as an encoder or a decoder in a circuit 100. To this effect, amplifier 103 is provided with a switching element 104, schematically illustrated as a mechanical switch, having two switching conditions. When switch 104 engages contact e, noise reduction circuit 150 is connected as a negative feedback circuit from the output to the inverting input of amplifier 103, as described above. When switch 104 is connected to contact d, a feedback resistor 105 is connected between the output and inverting input of amplifier 103, thus establishing the gain of the amplifier, and the output of amplifier 103 in such case is further connected to supply amplified information signals to noise reduction circuit 150. Thus, when switch 104 is connected to contact e, the illustrative circuit 100 functions as an encoder to produce level compressed information signals at output terminal 102. However, when switch 104 is coupled to contact d, circuit 100 functions as a decoder to produce level expanded signals at output terminal 142. In particular, when circuit 100 is used in its encoding mode, an input information signal from, for example, a microphone or receiver, is supplied through input terminal 101 and encoded and then supplied to output terminal 102 to be recorded on a record medium by a recording transducer such as a magnetic recording head. On the other hand, when circuit 100 is used in its decoding mode, an encoded information signal reproduced from a record medium and which is supplied from input terminal 101 is decoded and reproduced at output terminal 142.

Figure 9:
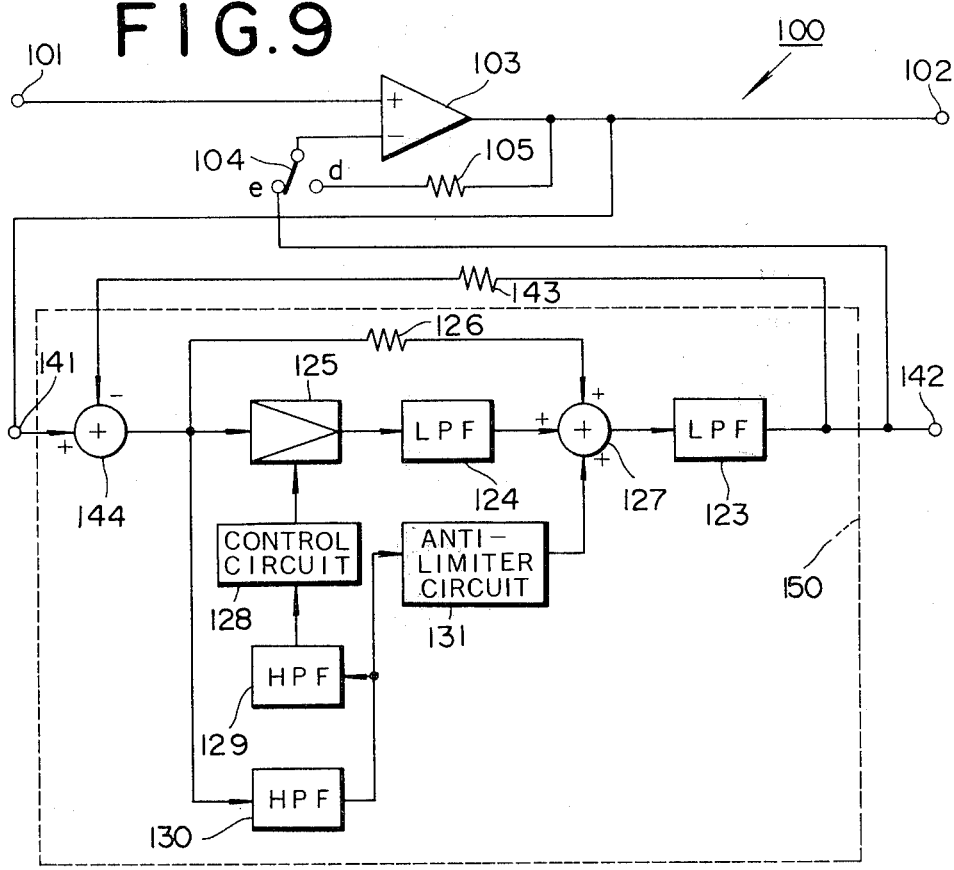
FIG. 9 is a block diagram showing the use of a modified version of the decoder circuit of FIG. 8 as an encoder or decoder in a noise reduction circuit according to the present invention.

The decoder circuit 150 of FIG. 9, which is encapsulated in the dashed line, is of substantially identical construction to decoder circuit 50 of FIG. 8. In particular, an input signal from input terminal 141 is supplied through an adding or positive input of a subtraction circuit 144 of decoder circuit 150 and the output from this latter circuit is supplied to a first signal path comprised of a variable gain amplifier 125 followed in series by a low-pass filter 124. The output of the latter circuit is connected to an adding input of an adder circuit 127. A first feedforward path comprised of a resistor 126 is supplied with the output of subtracting circuit 144 and, in turn, supplies an output to another adding input of adder circuit 127. A second feedforward path includes a high-pass filter 130 supplied with the output of subtracting circuit 144. An anti-limiting circuit 131 supplied with the output of high-pass filter 130 supplies an output to still another adding input of adder circuit 127. The output of high-pass filter 130 is also supplied to a control path for controlling the gain of variable gain amplifier 125 in much the same manner as the control path used in decoder circuit 50 of FIG. 8. In particular, the control path of decoder circuit 150 includes a high-pass filter 129 supplied with the output from high-pass filter 130. A control circuit 128 supplied with the output from high-pass filter 129 supplies a control signal to variable gain amplifier 125 to control the gain thereof so that the gain of variable gain amplifier 125 is high for high level input signals supplied to input terminal 141 and is low for low level input signals supplied thereto. The output of adder circuit 127 is supplied to a low-pass filter 123 and the output from low-pass filter 123 constitutes the output of decoder circuit 150. The output from low-pass filter 123 is also supplied through a feedback resistor 143 to a negative or subtracting input of subtracting circuit 144 where it is subtracted from the input signal supplied to input terminal 141.

If the transfer functions $F_1$ and $F_2$ of low-pass filters 123 and 124, respectively, are set as follows:

$$F_1 = g_1 \cdot \frac{1 + sT_2}{1 + sT_1} \tag{6}$$

$$F_2 = g_2 \cdot \frac{1 + sT_4}{1 + sT_3}, \tag{7}$$

where $s = j\omega$, and if $g_1 = g_2 = 10$ dB, $T_1 = 159$ μsec., $T_2 = 50$ μsec., $T_3 = 100$ μsec., and $T_4 = 31.8$ μsec., frequency characteristics which are inverse to those of FIGS. 4A and 4B are obtained for low-pass filters 123 and 124, respectively. In such case, the transfer function H of decoder circuit 150 is obtained as follows:

$$H = \frac{(F_2G + H_1)F_1}{1 + H_2F_1(F_2G + H_1)}, \tag{8}$$

where G is the gain of variable gain amplifier 125, $H_1$ is the transfer function for the feedforward signal path constituted by resistor 126, and $H_2$ is the transfer function of the feedback path constituted by resistor 143.

When switch 104 engages contact e, the transfer characteristic H of circuit 150 is used as the negative feedback gain of circuit 100. If the open loop gain of amplifier 103 is represented as A, then the overall gain or transfer function U of circuit 100 is obtained as follows:

$$U = A/(1 + AH) \qquad (9)$$

This, of course, is the gain of an amplifier having negative feedback. Now, if the gain A of amplifier 103 is very high, that is, the product AH is sufficiently large so that AH>1, then the gain or transfer characteristic of circuit 100, when disposed in its encoding configuration, is equal to 1/H. Thus, when circuit 100 is connected as a negative feedback circuit to amplifier 103, the overall characteristic of circuit 100 is converse, or complementary to the decoder transfer characteristic H. Hence, it is appreciated that, when circuit 100 is used as an encoder, a level compressed, pre-emphasized signal having a characteristic which is complementary to the decoder characteristic is produced for recording on the record medium.

It is appreciated that, by using noise reduction circuit 100 in two switchable modes, the same circuit can be used as an encoder and as a decoder, thus providing desirable conservation of parts. In typical recording/reproducer apparatus, such as in an audio tape recorder, information signals are not recorded and reproduced concurrently. Thus, rather than providing separate encoding and decoding circuitry, it is advantageous to utilize the same noise reduction circuit 100 for the separately performed encoding and decoding operations. Moreover, by using the same noise reduction circuits in both modes of operation, there is no difficulty in matching the characteristics of the encoder and decoder.

Figure 10:
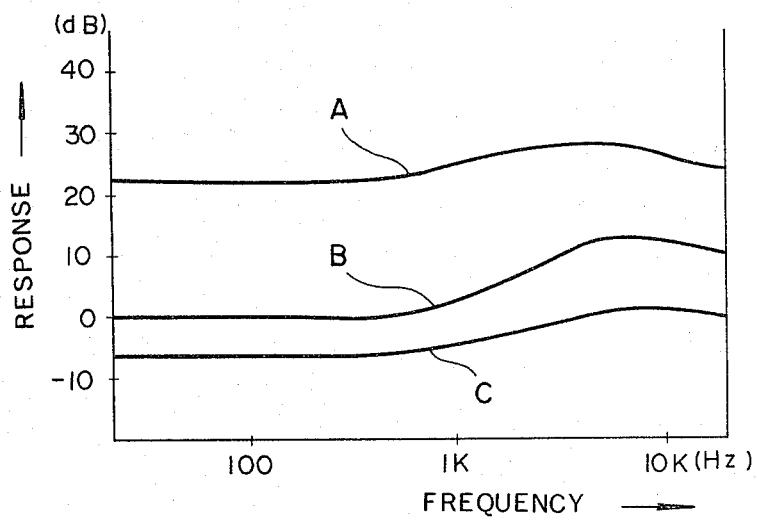
FIG. 10 is a graphical representation of the output level-frequency characteristic of the circuit of FIG. 9 when used as an encoder for various input signal levels.
Figure 11:
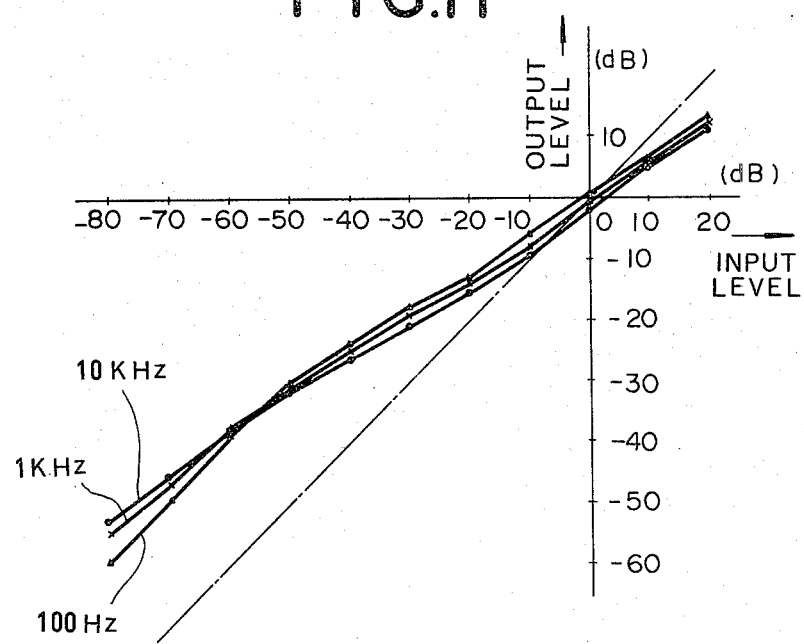
FIG. 11 is a graphical representation of the input-output level characteristic of the circuit of FIG. 9 when used as an encoder for various frequencies.

FIG. 10 shows the output level-frequency characteristic for noise reduction circuit 100 when used in its encoding mode. Curve A was obtained when the level of the input signal was extremely small. Curve B was obtained with a reference signal having a 0 db level and a frequency of 400 Hz for setting the gain of amplifier 125. A sweep signal which covered a range of frequencies from 100 Hz to 10 KHz was also used to obtain curve B. For curve C, the reference signal had a 10 db level and a frequency of 1 KHz. FIG. 11 shows the input-output level characteristic for frequencies of 10 KHz, 1 KHz and 100 Hz when noise reduction circuit 100 is used in its encoding mode with switch 104 connected to terminal e. It should be appreciated that the curves shown in FIG. 11 are grouped close to one another for low levels of the input signal so as to approximate the curves shown in FIG. 5.

Thus, in accordance with all of the above embodiments of this invention, a noise reduction circuit is provided which substantially reduces noise occurring as high as approximately 30 dB over the high frequency region of the input information signal so as to provide a dynamic operating range greater than 90 dB and which can be provided even when using a compact audio cassette tape recorder. In addition, the noise reduction circuit according to the present invention functions to minimize deterioration of the total quality of the reproduced sound. In particular, the noise reduction circuit according to this invention is particularly adapted to reduce noise modulation and tape sensitivity errors by providing a variable emphasis characteristic which is increased for intermediate level signals and is decreased for relatively low levels signals. Further, in order to minimize amplitude and frequency spectrum errors due to fluctuations of tape sensitivity, the input level dependency of the aforementioned variable emphasis systems is eliminated to a large extent by providing a constant compression ratio, for example, equal to 2, which is substantially independent of frequency over a wide range of input levels, for example, from 15 dB to −50 dB.

In addition, transient overshoots of the signal to be recorded on the magnetic tape, which result in distortion of the signal due to saturation of the magnetic tape, and which is caused by, for example, sudden increases in the level of the input signal, can be prevented by use of a limiting circuit in the encoder circuit which is operative only in the high frequency region of the input signal. Of course, a complementary anti-limiting circuit such as circuit 131 in FIG. 9 can be provided for the same purpose in the decoder circuit. In addition, the frequency band of the filter in the first signal path of each circuit and the filter connected in series with the first signal path, for example, low-pass filters 124 and 123 in FIG. 9, can be limited to decrease the sensitivity of the noise reduction circuit according to this invention in order to prevent malfunction of a system which operates over a wide frequency band.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit for noise reduction comprising:
   first means for providing frequency emphasis to a signal supplied thereto;
   a first signal path connected in series with said first means, and including variable gain amplifier means having controllable gain for amplifying a signal supplied thereto and second means for providing frequency emphasis to the signal passing through said variable gain amplifier means;
   means for controlling the gain of said variable gain amplifier means in response to the level of a signal in said first signal path; and
   means having a transfer characteristic substantially independent of frequency connected with said first signal path for reducing the effect of the frequency emphasis by said second means when the level of the signal passing through said variable gain amplifier means is reduced, wherein said circuit for noise reduction provides a first amount of frequency emphasis for intermediate level signals supplied thereto and a second lower amount of frequency emphasis for low level signals supplied thereto.

2. A circuit according to claim 1; in which said first signal path has an input and produces an output signal, and said means for reducing includes feedback means having a transfer characteristic substantially independent of frequency for negatively feeding back said output signal to the input of said first signal path so as to reduce the effect of the frequency emphasis by said second means when the level of the signal passing through said variable gain amplifier means is reduced.

3. A circuit according to claim 2; in which said feedback means includes a resistive element.

4. A circuit according to claim 2; in which said first signal path is supplied with an input signal, and said circuit further includes subtraction means for subtracting said negatively fed back output signal from said input signal to produce said signal which is passed through said variable gain amplifier means.

5. A circuit according to claim 2; further including feedforward means connected with said first signal path for reducing the effect of the frequency emphasis by said first and second means when the level of the signal passing through said variable gain amplifier means is high, wherein said circuit for noise reduction provides a third amount of frequency emphasis for high level signals supplied thereto which is lower than said first amount of frequency emphasis.

6. A circuit according to claim 5; in which said first means, said first signal path, said means for controlling and said feedback means form encoder means which produces a first encoded output signal in response to an input signal supplied thereto, and said feedforward means is supplied with said input signal and produces a feedforward output signal which is added to said first encoded output signal, the resultant added signal constituting the output of said circuit for noise reduction.

7. A circuit according to claim 6; in which said first means emphasizes the high frequency components of the signal supplied thereto relative to the low frequency components thereof; said second means emphasizes the high frequency components of the signal passing through said variable gain amplifier means relative to the low frequency components thereof; and said feedforward means provides, at most, relatively minor de-emphasis of the high frequency components of the input signal supplied to said encoder means relative to the low frequency components thereof.

8. A circuit according to claim 7; in which said feedforward means includes a low-pass filter, said first means includes a high-pass filter and said second means includes a high-pass filter.

9. A circuit according to claim 1; in which said first means emphasizes the high frequency components of the signal supplied thereto relative to the low frequency components thereof; and said second means emphasizes the high frequency components of the signal passing through said variable gain amplifier means relative to the low frequency components thereof.

10. A circuit according to claim 9; in which said first means includes a first high-pass filter, and said second means includes a second high-pass filter.

11. A circuit according to claim 1; in which said first signal path produces an output signal in response to an input signal supplied thereto, and said means for reducing includes feedforward means having a transfer characteristic substantially independent of frequency for positively feeding forward said input signal to be combined with said output signal so as to reduce the effect of the frequency emphasis by said second means when the level of the signal passing through said variable gain amplifier means is reduced.

12. A circuit according to claim 11; in which said feedforward means includes a resistive element.

13. A circuit according to claim 11; further including adder means for combining said input signal which is fed forward by said feedforward means and said output signal from said first signal path.

14. A circuit according to claim 11; further including feedback means connected with said first signal path for reducing the effect of the frequency emphasis by said first and second means when the level of the signal passing through said variable gain amplifier means is high, wherein said circuit for noise reduction provides a third amount of frequency emphasis for high level signal supplied thereto which is lower than said first amount of frequency emphasis.

15. A circuit according to claim 14; in which said first means, said first signal path, said means for controlling and said feedforward means form first decoder means having an input and which produces a first decoded output signal in response to an input signal supplied thereto, and said feedback means negatively feeds back said first decoded output signal to the input of said decoder means.

16. A circuit according to claim 15; further including subtraction means for subtracting said negatively fed back signal from a reproduced signal to produce said input signal supplied to said decoder means.

17. A circuit according to claim 15; in which said first means emphasizes the low frequency components of the signal supplied thereto relative to the high frequency components thereof; said second means emphasizes the low frequency components of the signal passing through said variable gain amplifier means relative to the high frequency components thereof; and said feedback means provides, at most, relatively minor de-emphasis of the high frequency components of the first decoded output signal relative to the low frequency components thereof.

18. A circuit according to claim 17; in which said first means includes a first low-pass filter, said second means includes a second low-pass filter and said feedback means includes a third low-pass filter.

19. A circuit according to claim 1; in which said first means emphasizes the low frequency components of the signal supplied thereto relative to the high frequency components thereof, and said second means emphasizes the low frequency components of the signal passing through said variable gain amplifier means relative to the high frequency components thereof.

20. A circuit according to claim 19; in which said first means includes a first low-pass filter, and said second means includes a second low-pass filter.

21. A circuit according to claim 17; in which said first decoder means and said feedback means form second decoder means having an input and an output; and further comprising amplifier means having an inverting input and an output connected to the input of said second decoder means.

22. A circuit according to claim 21, further including switch means having a first condition in which the output of said second decoder means is connected to the inverting input of said amplifier means so as to constitute a negative feedback circuit for said amplifier means, wherein said circuit for noise reduction operates in an encoding mode, and having a second condition in which the output of said amplifier means is connected to the inverting input thereof, wherein said circuit for noise reduction operates in a decoding mode.

23. A circuit according to claim 1; in which said variable gain amplifier means and said second means are connected in series, and said means for controlling includes level detecting means for controlling the gain of said variable gain amplifier means in response to the level of a signal from said first signal path.

24. A circuit according to claim 23; in which said variable gain amplifier means includes a voltage-controlled amplifier, and said level detecting means produces a gain control voltage in response to the voltage level of a signal from said first signal path and supplies said gain control voltage to said voltage-controlled amplifier for controlling the gain thereof.

25. A circuit according to claim 24; in which said means for controlling further includes weighting means for deriving a weighted signal from the high frequency components of a signal from said first signal path, and said level detecting means produces said gain control voltage from said weighted signal.

26. A circuit according to claim 25; in which said level detecting means causes the gain of said variable gain amplifier means to decrease for increasing levels of said signal from said first signal path and to increase for decreasing levels of said signal from said first signal path.

27. A circuit according to claim 23; in which said level detecting means causes the gain of said variable gain amplifier means to increase for increasing levels of said signal from said first signal path and to decrease for decreasing levels of said signal from said first signal path.

* * * * *